United States Patent
Hinkle (10) Patent No.: US 12,223,169 B2
(45) Date of Patent: Feb. 11, 2025

(54) FAR MEMORY DIRECT CACHING

(71) Applicant: Lenovo Global Technology (United States) Inc., Morrisville, NC (US)

(72) Inventor: Jonathan Hinkle, Raleigh, NC (US)

(73) Assignee: Lenovo Global Technology (United States) Inc., Morrisville, NC (US)

( * ) Notice: Subject to any disclaimer, the term of this patent is extended or adjusted under 35 U.S.C. 154(b) by 148 days.

(21) Appl. No.: 17/696,951

(22) Filed: Mar. 17, 2022

(65) Prior Publication Data

US 2023/0297236 A1    Sep. 21, 2023

(51) Int. Cl.
*G06F 3/06* (2006.01)

(52) U.S. Cl.
CPC ............ *G06F 3/0611* (2013.01); *G06F 3/064* (2013.01); *G06F 3/0659* (2013.01); *G06F 3/0673* (2013.01)

(58) Field of Classification Search
CPC ...... G06F 3/0611; G06F 3/064; G06F 3/0659; G06F 3/0673
See application file for complete search history.

(56) References Cited

U.S. PATENT DOCUMENTS

| | | | |
|---|---|---|---|
| 2016/0070486 A1* | 3/2016 | Anderson | G06F 9/44 711/103 |
| 2016/0335186 A1* | 11/2016 | Svendsen | G06F 12/126 |
| 2017/0046170 A1* | 2/2017 | Gu | G06F 9/4403 |
| 2021/0311643 A1* | 10/2021 | Shanbhogue | G06F 3/0679 |
| 2022/0197556 A1* | 6/2022 | Bert | G06F 3/0679 |
| 2023/0297246 A1* | 9/2023 | Nagai | G06F 3/0659 711/154 |

OTHER PUBLICATIONS

The nvm Express Base Specification Revision 1.4, published Jun. 10, 2019 (Year: 2019).*
An article titled 'Techopedia explains Cache Memory' attached to this office action based on a snapshot taken by arcive.org on Dec. 27, 2020, of the web page https://www.techopedia.com/definition/6307/cache-memory# (Year: 2020).*
An article title What are PCIe Slots and How Can I Use Them in My PC? by Dwight Pavlonic, Aug. 17, 2020 (Year: 2020).*
18-740 Fall 2010 Computer Architecture—Lecture 6: Caching Basic presentation (Year: 2010).*
Screen shot of https://www.snia.org/education/online-dictionary/N containing a definon of non-volatile memory to be NVRAM memory which is further defineid to be memory made impervious to data loss due to power failure through theuse of UPS, batteries, or technology such as flash memory. (Year: 2019).*

* cited by examiner

*Primary Examiner* — Michael Krofcheck
*Assistant Examiner* — Janice M. Girouard
(74) *Attorney, Agent, or Firm* — Jeffrey L. Streets (57) ABSTRACT

A far memory device includes a far memory controller, a memory device coupled to the controller, a first port coupled to the far memory controller to support communication with a host processor over a first serial computer expansion bus, and a second port coupled to the far memory controller to support communication with a non-volatile data storage drive over a second serial computer expansion bus. The far memory device serves as a cache between the host processor and the non-volatile data storage drive and may perform aspects of cache management on behalf of the host processor.

20 Claims, 5 Drawing Sheets

FIG. 1

| Memory Address Range (FAR Memory) | Namespace / Logic Block (NVMe Drive) | Dirty (Y/N) | Regular Memory (Y/N) |
|---|---|---|---|
| | | | |
| | | | |
| | | | |
| | | | |
| | | | |
| | | | |

FAR MEMORY DIRECT CACHING

BACKGROUND

The present disclosure relates to systems and methods for caching data for storage in a non-volatile data storage device.

BACKGROUND OF THE RELATED ART

Main memory coupled to a processor via a double data rate (DDR) computer bus, known as DDR-attached memory, can be used for caching data. For example, an operating system may include software to implement a page cache or a storage tier in the main memory of a computer. A page cache or disk cache is a cache for pages from a secondary storage device, such as a hard disk drive or a solid-state drive. The page cache may be maintained in an unused portion of the main memory, which provides the processor with quick access to the cached pages and improves the overall performance of the computer. A storage tier may involve different types (tiers) of data storage devices where the operating system software may be used to automatically move data from between tiers. Unfortunately, these solutions require significant processor interaction with the main memory and storage devices causing overhead and performance loss.

BRIEF SUMMARY

Some embodiments provide an apparatus comprising a far memory controller, one or more memory devices coupled to the far memory controller, a first port coupled to the far memory controller to support communication with a host processor over a first serial computer expansion bus, a second port coupled to the far memory controller to support communication with a non-volatile data storage drive over a second serial computer expansion bus, and at least one non-transitory storage device storing program instructions. The far memory controller includes at least one processor configured to process the program instructions, wherein the program instructions are configured to, when processed by the at least one processor, cause the processor to perform various operations. The operations comprise receiving a first write instruction from the host processor over the first serial computer expansion bus, wherein the first write instruction is) accompanied by data to be written to the one or more memory devices, an identity of a namespace and a logic block within the namespace that are associated with the data, and a memory address range associated with the namespace and logic block. The operations further comprise writing the data to the one or more memory devices at the memory address range, and storing, for the data written to the one or more memory devices, the namespace and the logic block within the namespace in association with the memory address range. Still further, the operations comprise marking the logic block within the namespace as being dirty in response to writing the data received from the host processor to the one or more memory devices, and sending a second write instruction to the non-volatile data storage drive over the second serial computer expansion bus, wherein the second write instruction includes the data associated with the dirty logic block and the identity of the namespace and the logic block within the namespace where the data is to be stored on the non-volatile data storage drive.

Some embodiments provide a computer program product comprising a non-volatile computer readable medium and non-transitory program instructions embodied therein, the program instructions being configured to be executable by a processor to cause the processor to perform various operations. The operations comprise receiving a first write instruction from the host processor over the first serial computer expansion bus, wherein the first write instruction is accompanied by data to be written to the one or more memory devices, an identity of a namespace and a logic block within the namespace that are associated with the data, and a memory address range associated with the namespace and logic block. The operations further comprise writing the data to the one or more memory devices at the memory address range, and storing, for the data written to the one or more memory devices, the namespace and the logic block within the namespace in association with the memory address range. Still further, the operations comprise marking the logic block within the namespace as being dirty in response to writing the data received from the host processor to the one or more memory devices, and sending a second write instruction to the non-volatile data storage drive over the second serial computer expansion bus, wherein the second write instruction includes the data associated with the dirty logic block and the identity of the namespace and the logic block within the namespace where the data is to be stored on the non-volatile data storage drive.

Some embodiments provide a computer program product comprising a non-volatile computer readable medium and non-transitory program instructions embodied therein, the program instructions being configured to be executable by a processor to cause the processor to perform various operations. The operations comprise identifying an address of particular data to be read, determining whether the particular data is stored in a far memory device accessible over a first serial computer expansion bus, reading the particular data from the far memory device over the second first serial computer expansion bus in response to determining that the particular data is stored on the far memory device, and reading the particular data directly from an non-volatile data storage drive over a second serial computer expansion bus in response to determining that the particular data is not stored on the far memory device.

DETAILED DESCRIPTION

Some embodiments provide an apparatus comprising a far memory controller, one or more memory devices coupled to the far memory controller, a first port coupled to the far memory controller to support communication with a host processor over a first serial computer expansion bus, a second port coupled to the far memory controller to support communication with an non-volatile data storage drive over a second serial computer expansion bus, and at least one non-transitory storage device storing program instructions. The far memory controller includes at least one processor configured to process the program instructions, wherein the program instructions are configured to, when processed by the at least one processor, cause the processor to perform various operations. The operations comprise receiving a first write instruction from the host processor over the first serial computer expansion bus, wherein the first write instruction is accompanied by data to be written to the one or more memory devices, an identity of a namespace and a logic block within the namespace that are associated with the data, and a memory address range associated with the namespace and logic block. The operations further comprise writing the data to the one or more memory devices at the memory address range, and storing, for the data written to the one or more memory devices, the namespace and the logic block within the namespace in association with the memory address range. Still further, the operations comprise marking the logic block within the namespace as being dirty in response to writing the data received from the host processor to the one or more memory devices, and sending a second write instruction to the non-volatile data storage drive over the second serial computer expansion bus, wherein the second write instruction includes the data associated with the dirty logic block and the identity of the namespace and the logic block within the namespace where the data is to be stored on the non-volatile data storage drive.

Memory may be categorized as being either "near" memory or "far" memory. Near memory is memory that is close ("near") to the central processing unit (CPU) of a computer, such as the cache memory that resides in the CPU chip, within the CPU package, or random-access memory (RAM) that the central processing unit may access over a double data rate (DDR) computer bus. Far memory is memory that is far from the central processing unit of the computer, such as a memory module that the central processing unit may access over a Peripheral Component Interconnect Express (PCIe) or Compute Express Link (CXL) serial computer expansion bus. In this sense, the term "far" refers primarily to the nature or type of connection between the CPU and the memory, and perhaps only secondarily to an actual physical distance between the CPU and the memory. Typically, far memory may have both a further physical distance from the CPU than near memory and a different type of connection than the near memory. For example, near memory may be directly connected to the motherboard, such as a dual in-line memory module (DIMM) inserted into a DDR slot on the motherboard. By contrast, far memory may be connected to a PCIe connector or port by a cable and may be positioned off the motherboard or even outside of the chassis containing the motherboard.

In some embodiments, the one or more memory devices included in the far memory device are volatile memory devices. For example, the volatile memory devices may be dynamic random-access memory (DRAM). Alternatively, the one or more memory devices included in the far memory device may be nonvolatile (persistent) memory devices, such as flash memory devices.

In some embodiments, the far memory controller manages caching of data being written from the host processor to the non-volatile data storage drive. The far memory controller may also manage communication with the host processor over the first serial computer expansion bus using a cache coherent protocol. Furthermore, the far memory controller may present the one or more memory device to the host processor as byte-addressable memory. The far memory controller may also map the data written in the far memory device to a location on the non-volatile data storage drive and store a lookup table on the one or more memory devices. The lookup table may includes a plurality of records, each record associating a memory address range on the far memory device with a namespace and logic block on the non-volatile data storage drive.

In some embodiments, the far memory controller may allow the host processor to use a first portion of capacity of the one or more memory devices as supplemental main memory while the far memory controller reserves a second portion of the capacity of the one or more memory devices to use as cache for the non-volatile data storage drive. The far memory controller preferably identifies the first portion of the far memory that is available for the host processor to use as regular memory and prevents the host processor from writing over data in the second portion of the far memory device.

Some embodiments provide a computer program product comprising a non-volatile computer readable medium and non-transitory program instructions embodied therein, the program instructions being configured to be executable by a processor to cause the processor to perform various operations. The operations comprise receiving a first write instruction from the host processor over the first serial computer expansion bus, wherein the first write instruction is accompanied by data to be written to the one or more memory devices, an identity of a namespace and a logic block within the namespace that are associated with the data, and a memory address range associated with the namespace and logic block. The operations further comprise writing the data to the one or more memory devices at the memory address range, and storing, for the data written to the one or more memory devices, the namespace and the logic block within the namespace in association with the memory address range. Still further, the operations comprise marking the logic block within the namespace as being dirty in response to writing the data received from the host processor to the one or more memory devices, and sending a second write instruction to the non-volatile data storage drive over the second serial computer expansion bus, wherein the second write instruction includes the data associated with the dirty logic block and the identity of the namespace and the logic block within the namespace where the data is to be stored on the non-volatile data storage drive. The foregoing computer program product embodiments may be performed by the far memory controller and may include any other operations described in reference to method and apparatus embodiments.

In some embodiments, the operations may further include the far memory device identifying a namespace and/or logic block that is associated with a memory address range for which data has been written in the memory in the far memory device. Still further, the operations may include the far memory device writing the data that is associated with the identified namespace and/or logic block to the non-volatile data storage device at the memory address range associated with the data.

In some embodiments, the operations may further include the far memory device presenting byte-addressable memory to the host processor, wherein the host processor reads the stored data from the far memory device using byte-addressable access to memory mapped files. For example, the host processor may read and write to cached data on the far memory device, through byte-addressable access to memory mapped files through Direct Access (DAX). Direct Access allows files to be mapped into memory and accessed as bytes instead of following normal file system block I/O conventions. The data stored in the far memory may be accessed in other manners, but DAX is a preferred application for providing byte-addressable access to memory mapped files.

In some embodiments, the operations may further include a far memory controller of the far memory device monitoring host processor writes to the memory device(s) included in the far memory device and identifying, for each write to the memory device(s), a namespace and logic block associated with the memory address range that has been written. Accordingly, the far memory controller may map the data written in the far memory device to a location on the non-volatile data storage drive. Such a map or table may be stored in the memory device(s) of the far memory device, preferably in an area of the memory that is separate from the data and dedicated to the map. In one option, the operations may further include the far memory controller marking a logic block as being dirty in response to the host processor writing to the memory device at a memory address within the logic block, and the far memory controller writing the logic block back to the non-volatile data storage drive in response to the logic block being marked as being dirty. Other caching procedures and protocols may also be implemented by the far memory controller.

In some embodiments, the far memory controller may act like a PCIe host for the non-volatile data storage drive when the far memory controller writes to the non-volatile data storage drive. The non-volatile data storage drive may operate as a normal dual-ported NVMe storage drive (i.e. a drive having two ports connected to two separate hosts). In this case, one host is the host processor (CPU) and the second host is the far memory controller. The host processor writes the map info (metadata of namespaces, logic blocks, associated memory address range, etc) to a specific address region in the far memory that is not overwritten by data. That map information is preferably stored separate from the data so that the far memory controller can quickly access the map information. Quick access to the map information may be beneficial to support writing data back to the non-volatile data storage drive and having this map information in a consistent location may prevent needless searching through the entire memory for map information inline with the data.

Some embodiments provide a computer program product comprising a non-volatile computer readable medium and non-transitory program instructions embodied therein, the program instructions being configured to be executable by a processor, such as a host processor, to cause the processor to perform various operations. The operations comprise identifying an address of particular data to be read, determining whether the particular data is stored in a far memory device accessible over a first serial computer expansion bus, reading the particular data from the far memory device over the first serial computer expansion bus in response to determining that the particular data is stored on the far memory device, and reading the particular data directly from an non-volatile data storage drive over a second serial computer expansion bus in response to determining that the particular data is not stored on the far memory device.

In some embodiments of the computer program product executable by the host processor, the operations may further include writing all data to the far memory device over the first serial computer expansion bus and providing a memory address range for the particular data being written to the far memory device.

In some embodiments of the computer program product executable by the host processor, the operations may further include identifying target data to be evicted from near memory in a host system including the processor and determining whether the host system is likely to request the target data within a predetermined immediately subsequent time period. Still further, the operations may include evicting the target data from the near memory in the host system to the far memory device over the first serial computer expansion bus in response to determining that the host system is likely to request the target data in the predetermined immediately subsequent time period, and evicting the target data from the near memory in the host system directly to the non-volatile data storage drive over the second serial computer expansion bus in response to determining that the host system is not likely to request the target data in the predetermined immediately subsequent time period.

In some embodiments, the far memory device could be used as an additional amount of regular RAM when not being used as a far memory caching device. However, the far memory controller should prevent the host from writing over data in the far memory device that has not yet been written back to the non-volatile data storage drive. The host processor is then responsible for managing any portion of the far memory that has been made available for the host to use as regular RAM, such as avoiding any overwriting of data the host processor wants to preserve. Any amount or region of the far memory may be used as regular memory, including none, all or some percentage, and any remaining amount or region of the far memory may be used as storage cache. The host processor may control the amount of the far memory that the host processor uses as regular memory, yet the far memory controller may prevent the host processor from overwriting existing data in the far memory that has not yet be written back to the non-volatile data storage drive. Accordingly, the far memory controller may identify those portions of far memory that are cleared and available for the host processor to use as regular memory. In a specific example, the operations performed by the host processor may include directing read and write operations to a first portion of memory capacity of the far memory device as supplemental RAM and directing read and write operations to a second portion of memory capacity of the far memory device as cache for the non-volatile data storage drive.

Some embodiments provide a method including a host processor reading data from a non-volatile data storage device over a serial computer expansion bus coupled to a first port of the non-volatile data storage device and the host processor writing data to a far memory device over a coherent protocol interface, wherein the host processor provides the far memory device with the data and a memory address range associated with the data. The method further includes the far memory device storing the data and the memory address range associated with the data in a memory device included in the far memory device and the host processor reading the stored data from the far memory device.

In some embodiments, the host processor may control what data is loaded into the far memory from the non-volatile data storage drive and any changes that are written back to the far memory. The host processor may maintain a simple lookup table to track what data is loaded in the far memory. The lookup table may be either stored internally (cache or memory on CPU) or in the main memory (DIMM). A copy of the table may also be stored in the far memory. If the far memory is persistent (non-volatile) memory, then it may be especially valuable to keep a copy of the lookup table in the persistent far memory so that if there is a loss of power then all "dirty" data that has not been written from far memory to non-volatile data storage drive can still be identified and preserved by writing the data back to the non-volatile data storage drive once power is restored. Furthermore, during normal operation, the host processor may use the lookup table to determine whether particular data may be read from the far memory device or directly from the non-volatile data storage drive. In one option, if the lookup table indicates that the far memory device contains the desired data (i.e., the host processor would experience a "hit" in the far memory), then the host processor will read the desired data from the far memory device since it may be the most up-to-date copy of the desired data. Conversely, if the lookup table indicates that the far memory device does not contain the desired data (i.e., the host processor would experience a "miss" in the far memory), then the host processor may read the desired data directly from the non-volatile data storage drive.

Some embodiments provide a computing system that includes a host processor, a non-volatile data storage device and a far memory device. The non-volatile data storage device includes a storage controller and data storage media coupled to the storage controller, wherein the storage controller is coupled to the host processor through a first serial computer expansion bus. The far memory device includes a far memory controller and one or more memory devices coupled to the far memory controller, wherein the far memory controller is coupled to the host processor by a coherent protocol interface and coupled to the storage controller via a second serial computer expansion bus.

In some embodiments of the computing system, the non-volatile data storage drive may include a drive controller and a plurality of flash memory storage chips. However, the non-volatile data storage drive may be any type of non-volatile data storage, such as a hard disk drive. To facilitate direct connections to both the host processor and the far memory device, the non-volatile data storage drive may include a first input/output port and a second input/output port.

In some embodiments of the computing system, the far memory device and/or non-volatile data storage drive may be located on the same node as the host processor or central processing unit. Alternatively, the far memory device and/or the non-volatile data storage drive may be located beyond the node that includes the host processor. For example, the far memory and/or the non-volatile data storage device may be coupled to the host processor via a backplane or other expansion bus/port. However, the PCIe and CXL interfaces require the far memory device and the non-volatile data storage device to be directly connected to the node that includes the host processor. In other words, the far memory device and the non-volatile data storage device do not communicate with the host processor over a network connection.

Embodiments of the computing system provide for a direct connection between a far memory device and a non-volatile data storage drive to support direct communication there between. A direct connection between the far memory device and the non-volatile data storage drive may be established through a backplane, a direct cable connection or through a PCIe/CXL switch. In addition to the direct connection between the far memory device and the non-volatile data storage drive, the far memory device and the non-volatile data storage drive may each have their own direct connection with the host processor, such as a PCIe connection, to support direct communication there between.

In some embodiments of the computing system, the coherent protocol interface that connects the far memory to the host processor may implement the Compute Express Link (CXL) open standard for high-speed CPU-to-device and CPU-to-memory connections. CXL is built on the PCIe physical and electrical interface with additional protocols for input/output (I/O), memory and cache coherence. With a CXL connection, the far memory device may leverage the CXL.mem memory protocol and/or CXL.cache cache protocol to present byte-addressable memory to the CPU.

In some embodiments, the host system may further include DDR-attached random-access memory (RAM) and may utilize the DDR-attached RAM independent of the far memory device. For example, the host system may include RAM, such as a DRAM chips on a DIMM attached to a DDR computer bus, that may be used for a wide range of memory needs, such as running an operating system and application programs. However, the host may use the far memory device in conjunction with the NVMe storage drive to allow fast access to data that's mostly kept in the storage device(s).

Some embodiments provide a technical benefit and improvement in technology of increasing system performance and reducing complexity of the caching storage through a new "FAR" memory device attached to the host through CXL. Specifically, embodiments provide a technical benefit in that the processor does not have to run a software stack to manage caching of data between the far memory and the non-volatile data storage drive. Rather, the caching of data between the far memory and the non-volatile data storage drive is mostly automated in hardware and firmware by the far memory device. So, the host processor does not have to use resource-consuming software to move data back and forth between the memory and the non-volatile data storage drive because the far memory controller maintains the map information and keeps the data storage current. Furthermore, the host processor has fast access to stored data through memory-mapped file access over a low-latency interface, such as CXL. Furthermore, embodiments of the far memory may include a volatile memory type because data stored in the far memory can be preserved by writing back to the non-volatile data storage drive. Still further, embodiments enable the processor to have higher bandwidth access to both the far memory device and the non-volatile data storage drive by reducing writes and reads on the CXL interface to the far memory device and the PCIe interface to the non-volatile data storage drive.

The foregoing computer program products may further include program instructions for implementing or initiating any one or more operations of the methods described herein. Embodiments may also include methods that include the operations described in reference to the program instructions of the computer program products. Furthermore, the apparatus and system embodiments may include program instructions to implement or initiate any one or more operations of the methods and computer program products described herein.

Figure 1:
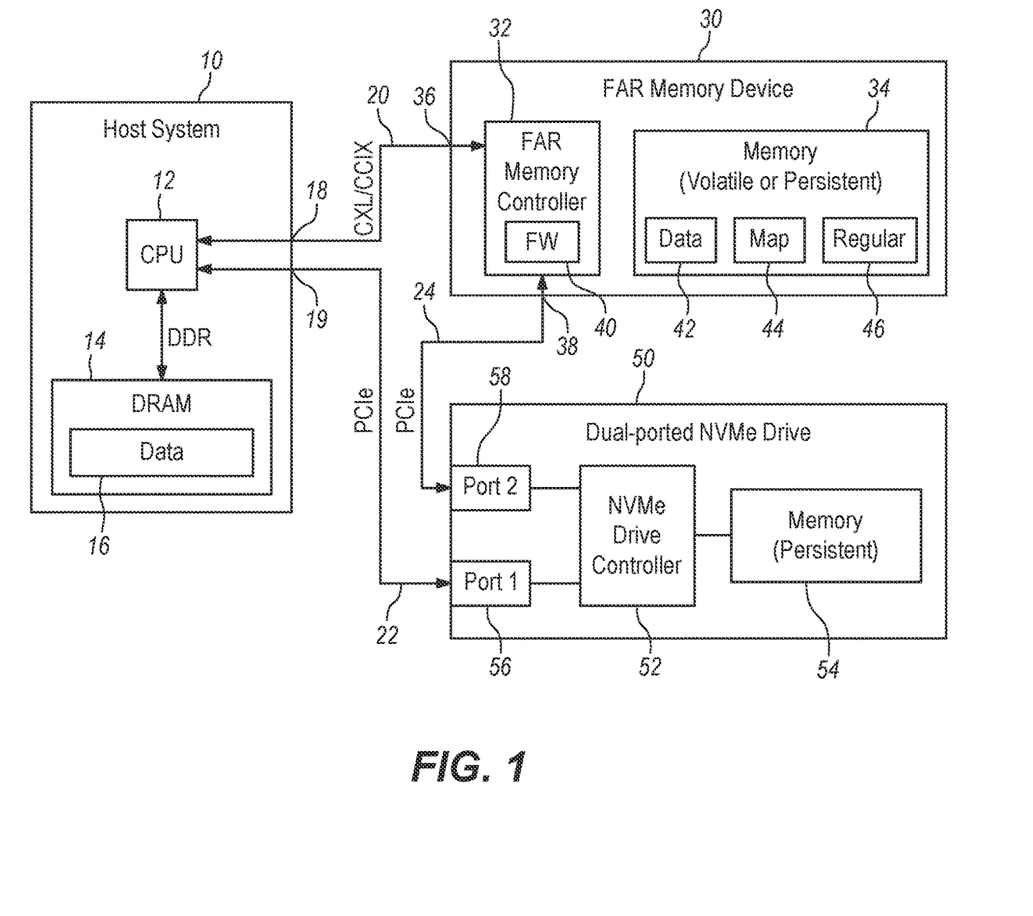
FIG. 1 is a diagram of a host system having connections to a far memory device and a dual-ported non-volatile data storage drive according to some embodiments.

FIG. 1 is a diagram of a host system 10 having connections to a far memory device 30 and a dual-ported non-volatile data storage drive 50 according to some embodiments. The host system 10 may have any suitable computer architecture, but specifically includes a central processing unit 12 and near memory 14, such as dynamic random-access memory (DRAM) coupled to a double data rate (DDR) memory bus. The near memory 14 or main memory of the host system 10 is able to store data 16, which may include both program instructions that are executable by the CPU 12 and data that is input to or output from the program instructions. The host system 10 may further include input and output ports 18, 19 that facilitate connections 20, 22 to peripheral devices, such as a first connection 20 to the far memory device 30 and a second connection 22 to the dual-ported non-volatile data storage drive 50. In this example, the first and second connections 20, 22 may be serial computer expansion bus connections. For example, the first serial computer expansion bus connection 20 may be operated as a Compute Express Link (CXL) connection and the second serial computer expansion bus connection 22 may be operated as a Peripheral Component Interconnect Express (PCIe).

The far memory device 30 includes a far memory controller 32, one or more memory devices 34 coupled to the far memory controller 32, a first port 36 coupled to the far memory controller to support communication with the host processor 12 over the first serial computer expansion bus connection 20, a second port 38 coupled to the far memory controller to support communication with the non-volatile data storage drive 50 over a third serial computer expansion bus connection 24, and at least one non-transitory storage device storing program instructions (see firmware 40). The far memory controller coherent protocol interface that connects the far memory to the host processor may implement the Compute Express Link (CXL). The far memory controller 32 includes at least one processor configured to process the program instructions (see firmware 40), wherein the program instructions are configured to, when processed by the at least one processor, cause the processor to perform various operations. The one or more memory devices 34 may be either volatile or persistent memory devices. In addition, the one or more memory devices 34 may store data 42 being cached, a map 44 associating the location or address of data 42 on the memory device 34 with a corresponding location or address on the non-volatile data storage drive 50, which may be a dual-ported NVMe drive. Optionally, the memory devices 34 may further include a portion that can be temporarily dedicated for use as regular memory 46 by the host processor 12. In one example, the third connection 24 may be operated as a PCIe connection.

The non-volatile data storage drive 50 includes a drive controller 52, persistent memory 54 coupled to the drive controller 52, a first port (Port 1) 56 coupled to the drive controller 52 for supporting the connection 22 to the host processor 12 and a second port (Port 2) 58 coupled to the drive controller 52 for supporting the connection 24 to the far memory controller 32. Optionally, the non-volatile data storage drive 50 may be an NVM Express (NVMe) drive.

Figure 2:
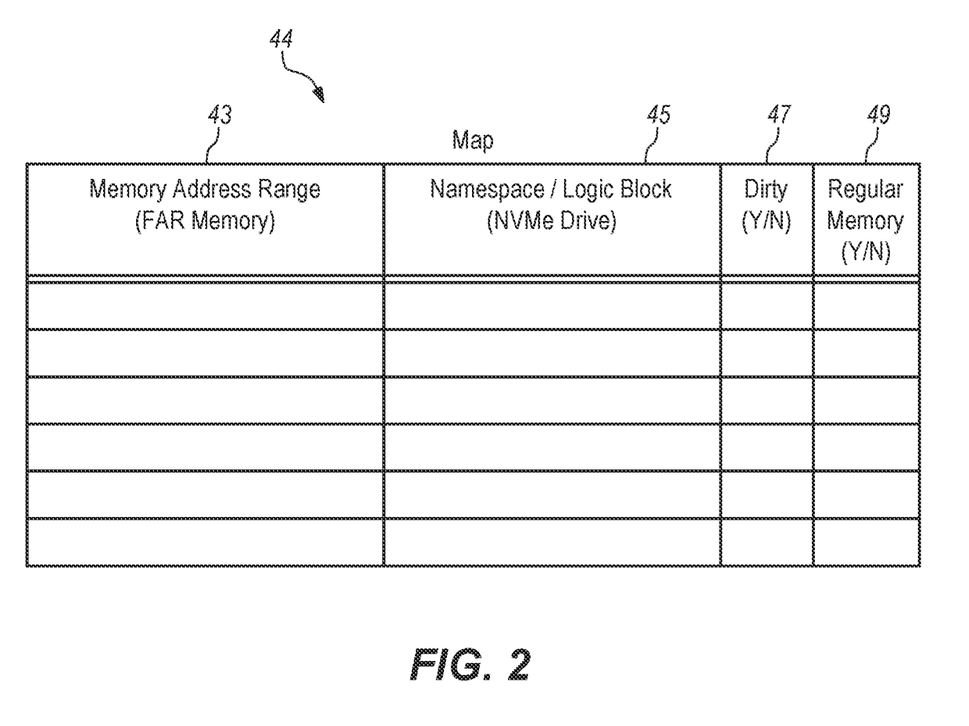
FIG. 2 is a table of a memory map according to some embodiments.

FIG. 2 is a table representing the memory map 44 according to some embodiments. Although the memory map 44 may have various data structures, the map 44 is illustrated as a table in which each row forms a record. The fields of each record are represented by the column headers and include a memory address range for data stored in the far memory device 34 (column 43), a namespace and logic block on the non-volatile data storage drive 50 (column 45), an identifier of whether the data in the memory address range of the far memory is dirty or not dirty (column 47), and an optional identifier of whether or not the memory address range is being used as regular memory by the host processor 12 (column 49) rather than cache memory. In this example, the far memory device 30 may provide byte-addressable memory and the non-volatile data storage drive 50 may provide block storage.

Figure 3:
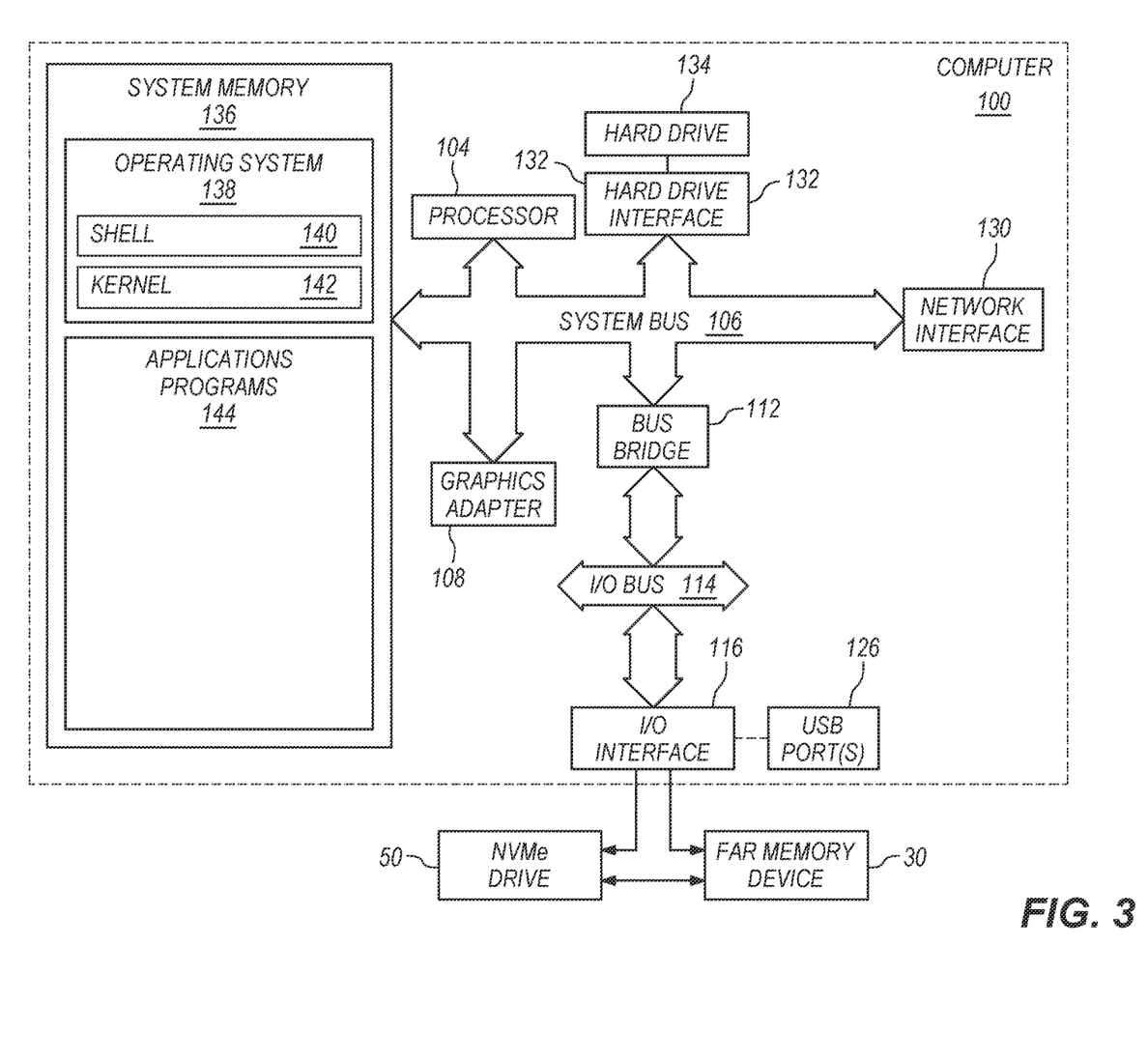
FIG. 3 is a diagram of a computer that may be representative of a host system according to some embodiments.

FIG. 3 is a diagram of a computer 100 that may be representative of a host system 10 of FIG. 1 for performing various operations in accordance with some embodiments. The computer 100 includes a processor unit 104 that is coupled to a system bus 106. The processor unit 104 may utilize one or more processors, each of which has one or more processor cores. A graphics adapter 108, which drives/supports the display 120, is also coupled to system bus 106. The graphics adapter 108 may, for example, include a graphics processing unit (GPU). The system bus 106 is coupled via a bus bridge 112 to an input/output (I/O) bus 114. An I/O interface 116 is coupled to the I/O bus 114. The I/O interface 116 affords communication with various I/O devices, including the far memory device 30 and the NVMe drive 50 and perhaps also a keyboard, mouse, touch screen, etc. (not shown). The I/O interface 116 also provides USB port(s) 126. As depicted, the computer 100 is able to communicate with other network devices over the network using a network adapter or network interface controller 130.

A hard drive interface 132 is also coupled to the system bus 106. The hard drive interface 132 interfaces with a hard drive 134. In a preferred embodiment, the hard drive 134 communicates with system memory 136 (main memory), which is also coupled to the system bus 106. System memory is defined as a lowest level of volatile memory in the computer 100. This volatile memory may include additional higher levels of volatile memory (not shown), including, but not limited to, cache memory, registers and buffers. Data that populates the system memory 136 may include an operating system (OS) 138 and application programs 144. Embodiments may include application programs that include the program instructions that causes the processor 104 to perform the operations according to one or more embodiments.

The operating system 138 for the computer 100 may include a shell 140 for providing transparent user access to resources such as the application programs 144. Generally, the shell 140 is a program that provides an interpreter and an interface between the user and the operating system. More specifically, the shell 140 executes commands that are entered into a command line user interface or from a file. Thus, the shell 140, also called a command processor, is generally the highest level of the operating system software hierarchy and serves as a command interpreter. The shell may provide a system prompt, interpret commands entered by keyboard, mouse, or other user input media, and send the interpreted command(s) to the appropriate lower levels of the operating system (e.g., a kernel 142) for processing. Note that while the shell 140 may be a text-based, line-oriented user interface, embodiments may support other user interface modes, such as graphical, voice, gestural, etc.

As depicted, the operating system 138 also includes the kernel 142, which may include lower levels of functionality for the operating system 138, including providing essential services required by other parts of the operating system 138 and application programs 144. Such essential services may include memory management, process and task management, disk management, and mouse and keyboard management.

Figure 4:
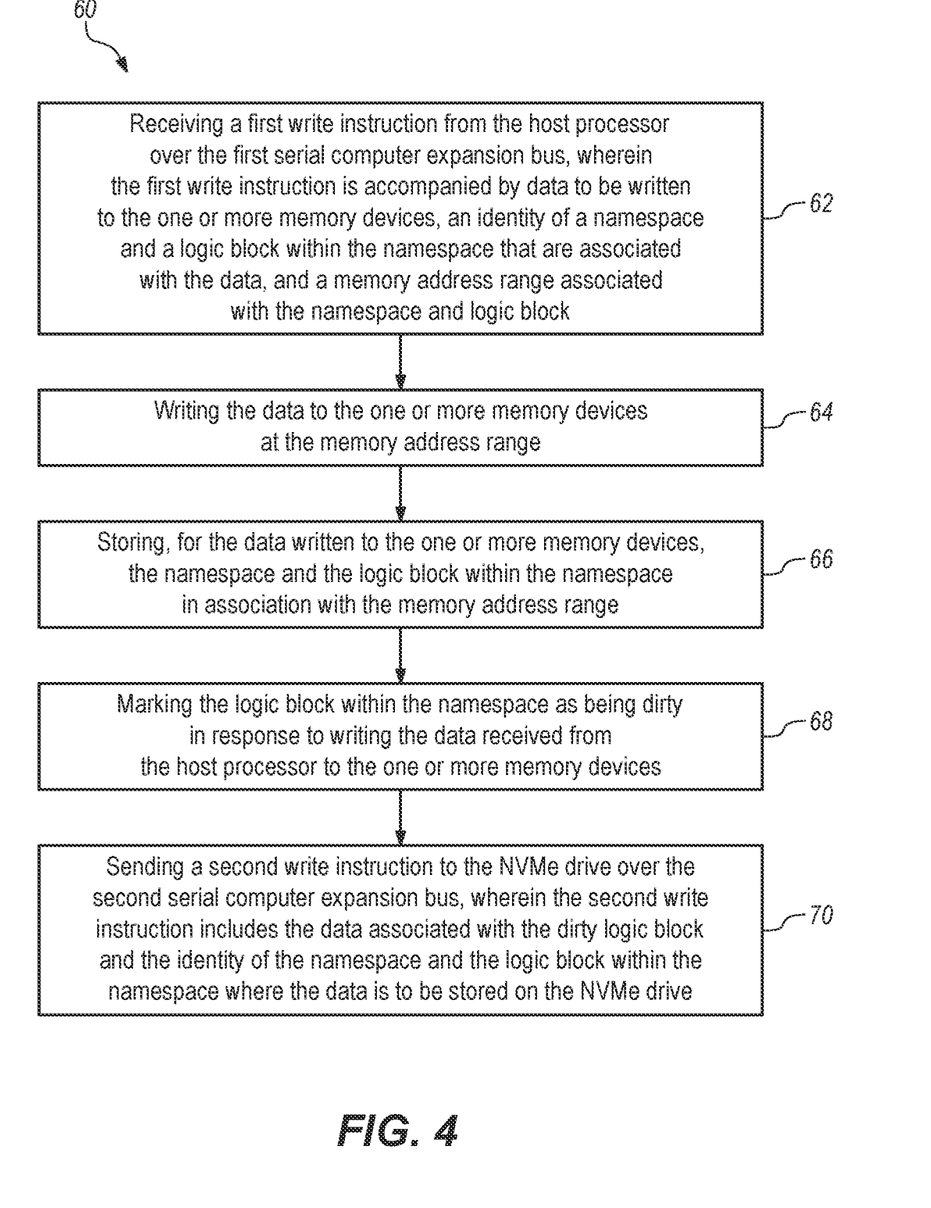
FIG. 4 is a flowchart of operations performed by a far memory controller according to some embodiments.

FIG. 4 is a flowchart of a method 60 performed by a far memory controller according to some embodiments. Operation 62 includes receiving a first write instruction from the host processor over the first serial computer expansion bus, wherein the first write instruction is accompanied by data to be written to the one or more memory devices, an identity of a namespace and a logic block within the namespace that are associated with the data, and a memory address range associated with the namespace and logic block. Operation 64 includes writing the data to the one or more memory devices at the memory address range. Operation 66 includes storing, for the data written to the one or more memory devices, the namespace and the logic block within the namespace in association with the memory address range.

Operation 68 includes marking the logic block within the namespace as being dirty in response to writing the data received from the host processor to the one or more memory devices. Operation 70 includes sending a second write instruction to the non-volatile data storage drive over the second serial computer expansion bus, wherein the second write instruction includes the data associated with the dirty logic block and the identity of the namespace and the logic block within the namespace where the data is to be stored on the non-volatile data storage drive.

Figure 5:
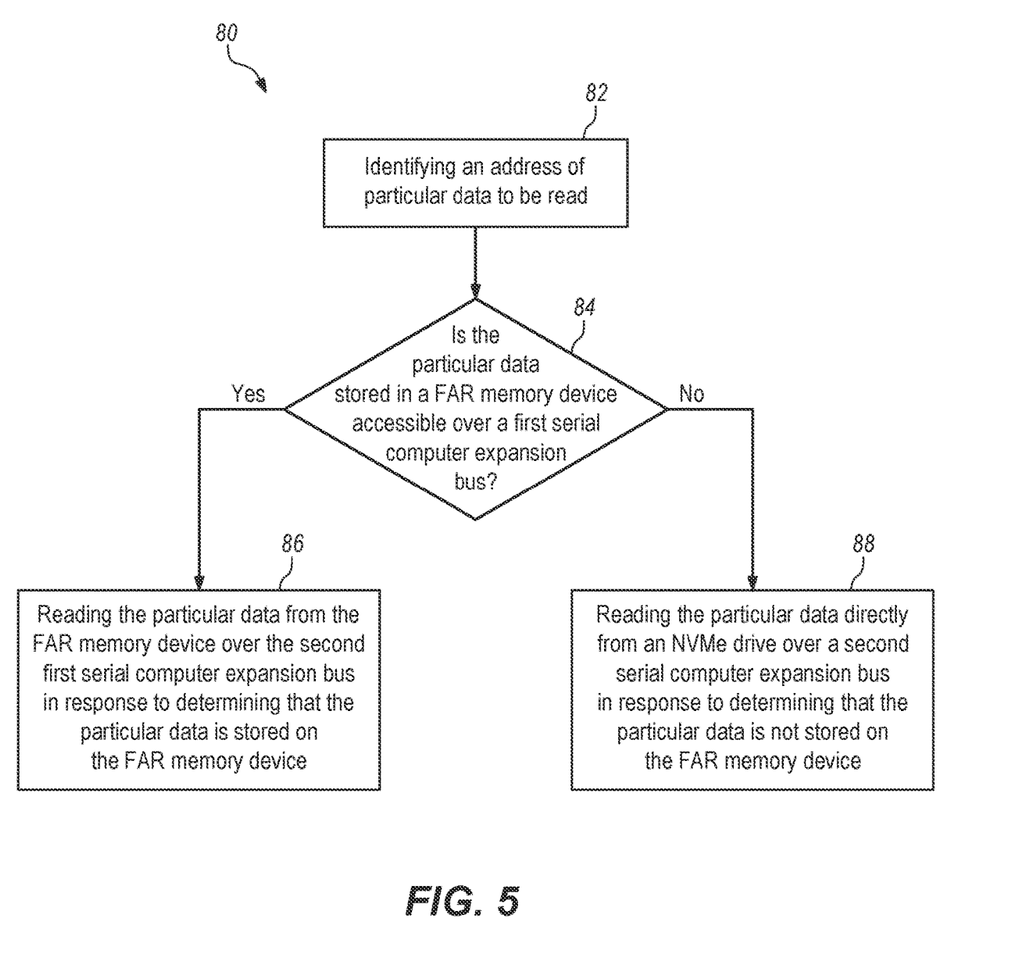
FIG. 5 is a flowchart of operations performed by a host processor according to some embodiments.

FIG. 5 is a flowchart of a method 80 performed by a host processor according to some embodiments. Operation 82 includes identifying an address of particular data to be read, determining whether the particular data is stored in a far memory device accessible over a first serial computer expansion bus. Operation 84 includes determining whether the particular data stored in a FAIR memory device is accessible over a first serial computer expansion bus. Operation 86 includes reading the particular data from the far memory device over the first serial computer expansion bus in response to determining that the particular data is stored on the far memory device. Operation 88 includes reading the particular data directly from an non-volatile data storage drive over a second serial computer expansion bus in response to determining that the particular data is not stored on the far memory device.

As will be appreciated by one skilled in the art, embodiments may take the form of a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device. Furthermore, any program instruction or code that is embodied on such computer readable storage media (including forms referred to as volatile memory) that is not a transitory signal are, for the avoidance of doubt, considered "non-transitory".

Program code embodied on a computer readable storage medium may be transmitted using any appropriate medium, including but not limited to wireless, wireline, optical fiber cable, RF, etc., or any suitable combination of the foregoing. Computer program code for carrying out various operations may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments may be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored on computer readable storage media is not a transitory signal, such that the program instructions can direct a computer, other programmable data processing apparatus, or other devices to function in a particular manner, and such that the program instructions stored in the computer readable storage medium produce an article of manufacture.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. An apparatus, comprising:
    a dual-ported far memory device including a far memory controller, one or more memory devices coupled to the far memory controller, a first external port coupled to the far memory controller to support communication with a host processor over a first serial computer expansion bus, a second external port coupled to the far memory controller to support communication with a non-volatile data storage drive over a second serial computer expansion bus, and at least one non-transitory storage device storing program instructions, wherein the far memory controller includes at least one processor configured to process the program instructions, and wherein the program instructions are configured to, when processed by the at least one processor, cause the processor to perform operations comprising:
        receiving, from the host processor over the first serial computer expansion bus, a first write instruction, data to be written to the one or more memory devices, an identity of a namespace and a logic block within the namespace that are associated with the data, and a memory address range associated with the namespace and logic block;
        writing the data to the one or more memory devices at the memory address range;
        storing, for the data written to the one or more memory devices, the namespace and the logic block within the namespace in association with the memory address range;
        marking the logic block within the namespace as being dirty in response to writing the data to the one or more memory devices; and
        sending a second write instruction to the non-volatile data storage drive over the second serial computer expansion bus, wherein the second write instruction includes the data associated with the logic block marked as being dirty and the identity of the namespace and the logic block within the namespace where the data is to be stored on the non-volatile data storage drive.

2. The apparatus of claim 1, the operations further comprising:
    managing communication with the host processor over the first serial computer expansion bus using a cache coherent protocol.

3. The apparatus of claim 2, wherein the cache coherent protocol is a Compute Express Link protocol.

4. The apparatus of claim 1, wherein the one or more memory devices coupled to the far memory controller are volatile memory devices.

5. The apparatus of claim 1, wherein the one or more memory devices coupled to the far memory controller are non-volatile memory devices.

6. The apparatus of claim 1, the operations further comprising:
    presenting the one or more memory device to the host processor as byte-addressable memory.

7. The apparatus of claim 1, the operations further comprising:
    mapping the data written in the far memory device to a location on the non-volatile data storage drive; and
    storing a lookup table on the one or more memory devices, wherein the lookup table includes a plurality of records, each record associating a memory address range on the far memory device with a namespace and logic block on the non-volatile data storage drive.

8. The apparatus of claim 1, wherein the far memory controller manages caching of data being written to the non-volatile data storage device.

9. The apparatus of claim 1, wherein the far memory controller allows the host processor to use a first portion of capacity of the one or more memory devices as supplemental main memory while the far memory controller reserves a second portion of the capacity of the one or more memory devices to use as cache for the non-volatile data storage drive.

10. The apparatus of claim 9, wherein the far memory controller identifies the first portion of the far memory that is available for the host processor to use as regular memory and prevents the host processor from writing over data in the second portion of the far memory device.

11. A computer program product comprising a non-volatile computer readable medium and non-transitory program instructions embodied therein, the non-transitory program instructions being configured to be executable by a processor of a far memory controller in a dual-ported far memory device to cause the processor to perform operations comprising:
    receiving, from a host processor over a first serial computer expansion bus coupled to a first external port of the far memory device, a first write instruction, data to be written to one or more memory devices, an identity of a namespace and a logic block within the namespace that are associated with the data, and a memory address range associated with the namespace and logic block;
    writing the data to the one or more memory devices at the memory address range;
    storing, for the data written to the one or more memory devices, the namespace and the logic block within the namespace in association with the memory address range;
    marking the logic block within the namespace as being dirty in response to writing the data to the one or more memory devices; and
    sending a second write instruction to a non-volatile data storage drive over a second serial computer expansion bus coupled to a second external port of the far memory device, wherein the second write instruction includes the data associated with the logic block marked as being dirty and the identity of the namespace and the logic block within the namespace where the data is to be stored on the non-volatile data storage drive.

12. The computer program product of claim 11, the operations further comprising:
managing communication with the host processor over the first serial computer expansion bus using a cache coherent protocol.

13. The computer program product of claim 11, the operations further comprising:
presenting the one or more memory device to the host processor as byte-addressable memory.

14. The computer program product of claim 11, the operations further comprising:
mapping the data written in the far memory device to a location on the non-volatile data storage drive; and
storing a lookup table on the one or more memory devices, wherein the lookup table includes a plurality of records, each record associating a memory address range on the far memory device with a namespace and logic block on the non-volatile data storage drive.

15. The computer program product of claim 11, the operations further comprising:
managing caching of data being written to the non-volatile data storage drive.

16. The computer program product of claim 11, the operations further comprising:
allowing the host processor to use a first portion of capacity of the one or more memory devices as supplemental main memory and reserving a second portion of the capacity of the one or more memory devices to use as cache for the non-volatile data storage drive.

17. A computer program product comprising a non-volatile computer readable medium and non-transitory program instructions embodied therein, the non-transitory program instructions being configured to be executable by a processor to cause the processor to perform operations comprising:
identifying an address of particular data to be read;
determining whether the particular data is stored in a dual-ported far memory device accessible over a first serial computer expansion bus coupled to a first external port of the dual-ported far memory device or stored in a dual-ported non-volatile data storage drive accessible over a second serial computer expansion bus coupled to a first external port of the dual-ported non-volatile data storage drive, wherein a second external port of the dual-ported far memory device is coupled to a second external port of the dual-ported non-volatile data storage drive via a third serial computer expansion bus for saving data from the dual-ported far memory device to the dual-ported non-volatile data storage drive;
reading the particular data from the far memory device over the first serial computer expansion bus in response to determining that the particular data is stored on the far memory device; and
reading the particular data directly from the non-volatile data storage drive over the second serial computer expansion bus in response to determining that the particular data is not stored on the far memory device.

18. The computer program product of claim 17, the operations further comprising:
writing all data to the far memory device over the first serial computer expansion bus; and
providing a memory address range for the particular data being written to the far memory device.

19. The computer program product of claim 17, the operations further comprising:
identifying target data to be evicted from near memory in a host system including the processor;
determining whether the host system is likely to request the target data within a predetermined immediately subsequent time period;
evicting the target data from the near memory in the host system to the far memory device over the first serial computer expansion bus in response to determining that the host system is likely to request the target data in the predetermined immediately subsequent time period; and
evicting the target data from the near memory in the host system directly to the non-volatile data storage drive over the second serial computer expansion bus in response to determining that the host system is not likely to request the target data in the predetermined immediately subsequent time period.

20. The computer program product of claim 17, the operations further comprising:
directing read and write operations to a first portion of memory capacity of the far memory device as supplemental RAM; and
directing read and write operations to a second portion of memory capacity of the far memory device as cache for the non-volatile data storage drive.

* * * * *